US012763726B2

(12) United States Patent
Curry et al.

(10) Patent No.: US 12,763,726 B2
(45) Date of Patent: Oct. 13, 2026

(54) DYNAMIC TUNING OF AN OFF VOLTAGE-CONTROLLED OSCILLATOR (VCO) OF A MULTI-CORE VCO IN A REDUCED-CORE MODE

(71) Applicant: QUALCOMM Incorporated, San Diego, CA (US)

(72) Inventors: Aaron Curry, Long Beach, CA (US); Payam Lajevardi, Sunnyvale, CA (US); Emanuele Lopelli, Laguna Niguel, CA (US); Yanan Wu, Santa Clara, CA (US); Dawei Mai, Santa Clara, CA (US); Zhanjun Bai, San Jose, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 18/609,078

(22) Filed: Mar. 19, 2024

(65) Prior Publication Data

US 2025/0300601 A1 Sep. 25, 2025

(51) Int. Cl.
*H03B 5/12* (2006.01)

(52) U.S. Cl.
CPC ......... *H03B 5/1253* (2013.01); *H03B 5/1212* (2013.01); *H03B 5/1228* (2013.01)

(58) Field of Classification Search
CPC .................................................... H03B 5/1253
USPC ...................................................... 331/117 R
See application file for complete search history.

(56) References Cited

U.S. PATENT DOCUMENTS

| | | | | | |
|---|---|---|---|---|---|
| 6,072,371 | A * | 6/2000 | Kobayashi | H03B 5/1847 331/49 |
| 6,657,500 | B1 * | 12/2003 | Chen | G06F 30/367 331/34 |
| 2006/0033587 | A1 * | 2/2006 | Cabanillas | H03B 5/1212 331/108 C |
| 2009/0128240 | A1 * | 5/2009 | Miyagi | H03L 7/18 331/16 |
| 2015/0349711 | A1 * | 12/2015 | Han | H03B 5/12 331/46 |
| 2016/0072512 | A1 * | 3/2016 | Khalili | H04B 1/0064 331/2 |
| 2019/0207611 | A1 * | 7/2019 | Damphousse | H03L 7/07 |

* cited by examiner

*Primary Examiner* — Joseph Chang
(74) *Attorney, Agent, or Firm* — Gerald P. Joyce, III

(57) ABSTRACT

Certain aspects of the present disclosure are directed towards methods and apparatus for oscillating signal generation. An example method generally includes: configuring a first voltage-controlled oscillator (VCO) core of a multi-core VCO based on an oscillating frequency of a second VCO core of the multi-core VCO; and generating, via the second VCO core, an oscillating signal with the oscillating frequency, wherein the first VCO core is off while the oscillating signal is generated via the second VCO core.

18 Claims, 8 Drawing Sheets

DYNAMIC TUNING OF AN OFF VOLTAGE-CONTROLLED OSCILLATOR (VCO) OF A MULTI-CORE VCO IN A REDUCED-CORE MODE

TECHNICAL FIELD

Certain aspects of the present disclosure generally relate to electronic circuits and, more particularly, to techniques for tuning a multi-core voltage-controlled oscillator (VCO).

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, Fifth Generation (5G) New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include one or more frequency synthesizers implemented with voltage-controlled oscillators (VCOs).

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include reducing phase noise.

Certain aspects of the present disclosure are directed towards a method for oscillating signal generation. The method generally includes: configuring a first voltage-controlled oscillator (VCO) core of a multi-core VCO based on an oscillating frequency of a second VCO core of the multi-core VCO; and generating, via the second VCO core, an oscillating signal with the oscillating frequency, wherein the first VCO core is off while the oscillating signal is generated via the second VCO core.

Certain aspects of the present disclosure are directed towards a multi-core VCO. The multi-core VCO generally includes: a first VCO core selectively coupled to one or more outputs of the multi-core VCO; and a second VCO core selectively coupled to the one or more outputs of the multi-core VCO, the first VCO core being capable of being configured based on an oscillating frequency of the second VCO core, wherein the second VCO core is configured to generate an oscillating signal with the oscillating frequency, and wherein the first VCO core is configured to be off while the oscillating signal is generated via the second VCO core.

Certain aspects of the present disclosure are directed towards a wireless device. The wireless device generally includes: one or more antennas; and a transmitter or receiver coupled to the antenna and including a frequency synthesizer, wherein the frequency synthesizer includes a multi-core VCO, comprising: a first VCO core selectively coupled to one or more outputs of the multi-core VCO; and a second VCO core selectively coupled to the one or more outputs of the multi-core VCO, the first VCO core being capable of being configured based on an oscillating frequency of the second VCO core, wherein the second VCO core is configured to generate an oscillating signal with the oscillating frequency, and wherein the first VCO core is configured to be off while the oscillating signal is generated via the second VCO core.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
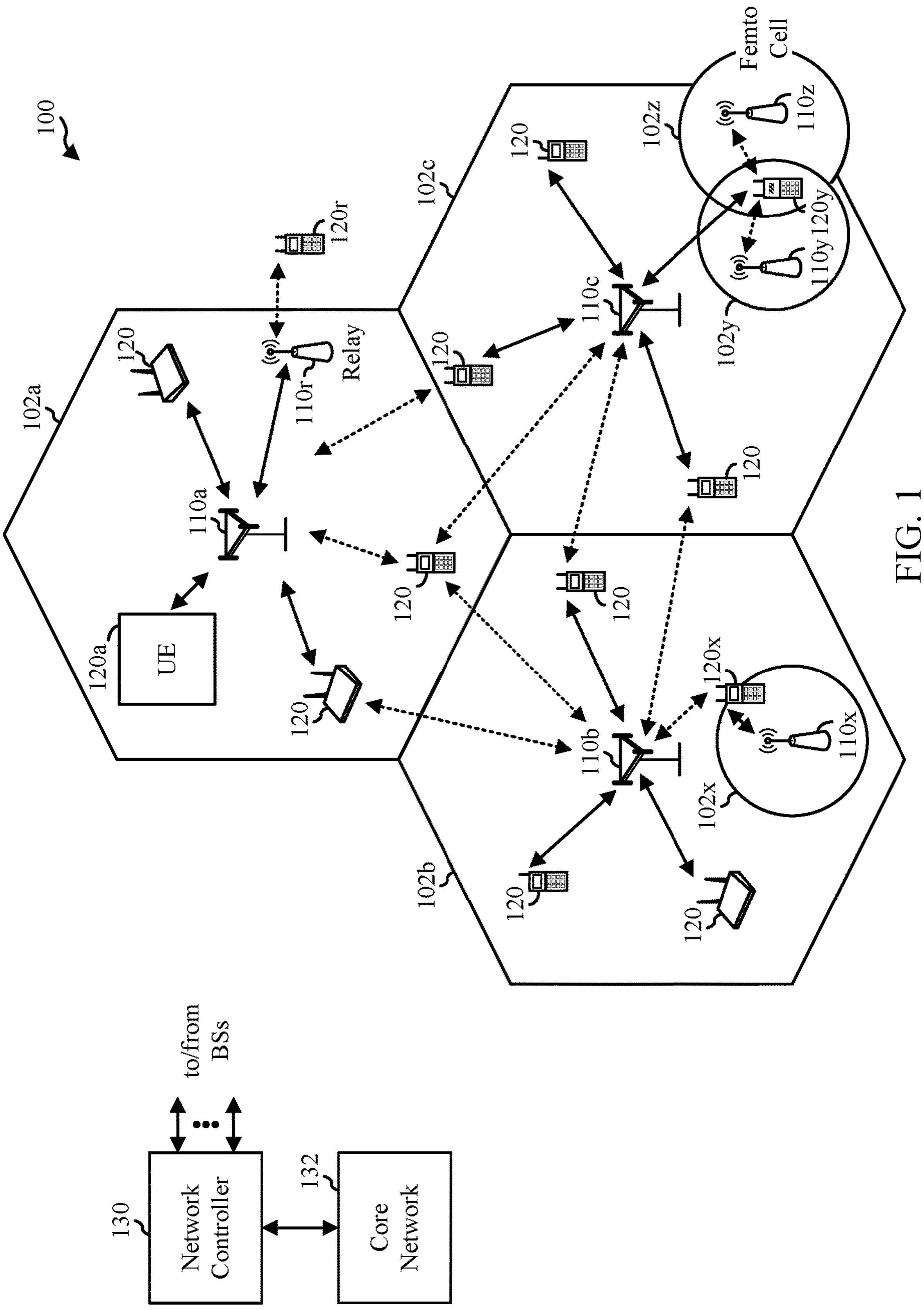
FIG. 1 is a diagram of an example wireless communications network, in which aspects of the present disclosure may be practiced.

Certain aspects of the present disclosure are directed towards techniques for operating a multi-core voltage-controlled oscillator (VCO). In some cases, a multi-core VCO may be operated with one or more VCO cores turned off (e.g., decoupled from one or more outputs of the multi-core VCO) in a reduced-core mode. In some aspects, tuning of the off VCO core may be changed based on whether at least one on VCO core is operated within a lower portion or higher portion of the VCO core frequency range. Tuning of the off VCO core may involve configuring a capacitor bank coupled between the outputs of the off VCO core using a capacitor code (e.g., a digital signal controlling switches of the capacitor bank). In some cases, the capacitor code for the off VCO core may be changed during a frequency search phase for the on VCO core. In some cases, the change in tuning of the off VCO core may occur once during the frequency search phase, as described in more detail herein. When the on VCO core is operating within a lower portion of the frequency range, the capacitor code for the off VCO core may be set to a maximum capacitor code value (e.g., corresponding to a maximum frequency). When the on VCO core is operating within a higher portion of the frequency range, the capacitor code for the off VCO core may be set to a minimum capacitor code value (e.g., corresponding to a minimum frequency).

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110*a-z* (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110*a*, 110*b*, and 110*c* may be macro BSs for the macro cells 102*a*, 102*b*, and 102*c*, respectively. The BS 110*x* may be a pico BS for a pico cell 102*x*. The BSs 110*y* and 110*z* may be femto BSs for the femto cells 102*y* and 102*z*, respectively. A BS may support one or multiple cells.

The BSs 110 communicate with one or more user equipment's (UEs) 120*a-y* (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, $N_{dn}$ UEs may be selected for simultaneous transmission on the downlink. $N_{up}$ may or may not be equal to $N_{dn}$, and $N_{up}$ and $N_{dn}$ may be static values or can change for each scheduling interval. Beam-steering or some other spatial processing technique may be used at the BSs 110 and/or UEs 120.

The UEs 120 (e.g., 120*x*, 120*y*, etc.) may be dispersed throughout the wireless communications network 100, and each UE 120 may be stationary or mobile. The wireless communications network 100 may also include relay stations (e.g., relay station 110*r*), also referred to as relays or the like, that receive a transmission of data and/or other information from an upstream station (e.g., a BS 110*a* or a UE 120*r*) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number $N_{ap}$ of antennas to achieve transmit diversity for downlink transmissions and/or receive diversity for uplink transmissions. A set $N_u$ of UEs 120 may receive downlink transmissions and transmit uplink transmissions. Each UE 120 may transmit user-specific data to and/or receive user-specific data from the BSs 110. In general, each UE 120 may be equipped with one or multiple antennas. The $N_u$ UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a “system controller”) may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include a multi-core voltage-controlled oscillator (VCO) where one or more VCO cores of the multi-core VCO are turned off and tuned to reduce impact of the off VCO core on the phase noise of the on VCO core, as described in more detail herein.

Figure 2:
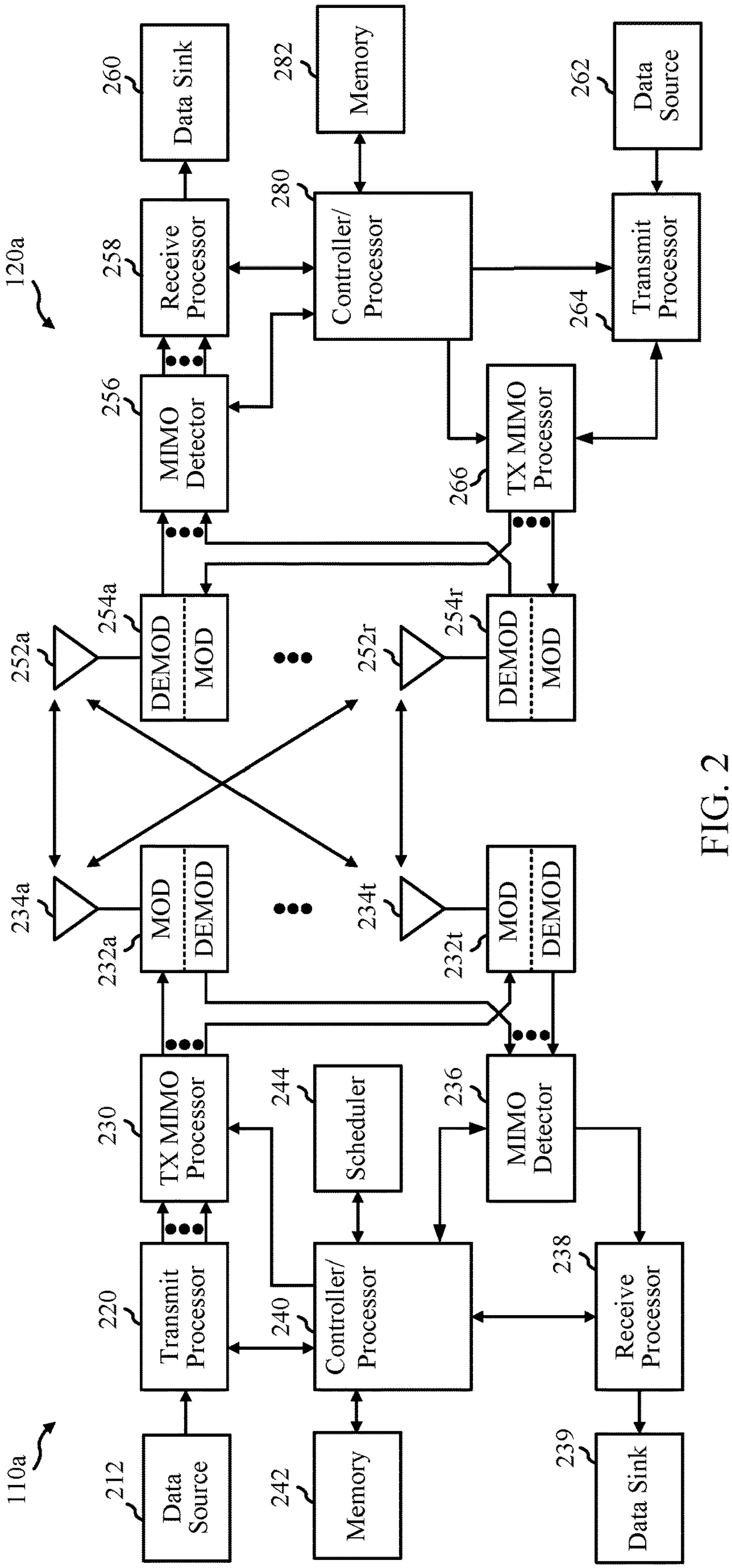
FIG. 2 is a block diagram conceptually illustrating a design of an example base station (BS) and user equipment (UE), in which aspects of the present disclosure may be practiced.

FIG. 2 illustrates example components of BS 110*a* and UE 120*a* (e.g., from the wireless communications network 100 of FIG. 1), in which aspects of the present disclosure may be implemented.

On the downlink, at the BS 110*a*, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARQ) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232*a*-232*t*. Each modulator in transceivers 232*a*-232*t* may process a respective output symbol stream (e.g., for orthogonal frequency division multiplexing (OFDM), etc.) to obtain an output sample stream. Each of the transceivers 232*a*-232*t* may further process (e.g., convert to analog, amplify, filter, and upconvert) the output sample stream to obtain a downlink signal. Downlink signals from the transceivers 232*a*-232*t* may be transmitted via the antennas 234*a*-234*t*, respectively.

At the UE 120*a*, the antennas 252*a*-252*r* may receive the downlink signals from the BS 110*a* and may provide received signals to the transceivers 254*a*-254*r*, respectively. The transceivers 254*a*-254*r* may condition (e.g., filter, amplify, downconvert, and digitize) a respective received signal to obtain input samples. Each demodulator (DEMOD) in the transceivers 232*a*-232*t* may further process the input samples (e.g., for OFDM, etc.) to obtain received symbols. A MIMO detector 256 may obtain received symbols from all the demodulators in transceivers 254*a*-254*r*, perform MIMO detection on the received symbols if applicable, and provide detected symbols. A receive processor 258 may process (e.g., demodulate, deinterleave, and decode) the detected symbols, provide decoded data for the UE 120*a* to a data sink 260, and provide decoded control information to a controller/processor 280.

On the uplink, at UE 120*a*, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254*a*-254*r* (e.g., for single-carrier frequency division multiplexing (SC-FDM), etc.), and transmitted to the BS 110*a*. At the BS 110*a*, the uplink signals from the UE 120*a* may be received by the antennas 234, processed by the demodulators in transceivers 232*a*-232*t*, detected by a MIMO detector 236 if applicable, and further processed by a receive processor 238 to obtain decoded data and control information sent by the UE 120*a*. The receive processor 238 may provide the decoded data to a data sink 239 and the decoded control information to the controller/processor 240.

The memories 242 and 282 may store data and program codes for BS 110*a* and UE 120*a*, respectively. The memories 242 and 282 may also interface with the controllers/processors 240 and 280, respectively. A scheduler 244 may schedule UEs for data transmission on the downlink and/or uplink.

In certain aspects of the present disclosure, the transceivers 232 and/or the transceivers 254 may include a multi-core VCO where one or more VCO cores of the multi-core VCO are turned off and tuned to reduce impact of the off VCO core on the phase noise of the on VCO core, as described in more detail herein.

NR may utilize orthogonal frequency division multiplexing (OFDM) with a cyclic prefix (CP) on the uplink and downlink. NR may support half-duplex operation using time division duplexing (TDD). OFDM and single-carrier frequency division multiplexing (SC-FDM) partition the system bandwidth into multiple orthogonal subcarriers, which are also commonly referred to as tones, bins, etc. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The system bandwidth may also be partitioned into subbands. For example, a subband may cover multiple resource blocks (RBs).

Example RF Transceiver

Figure 3:
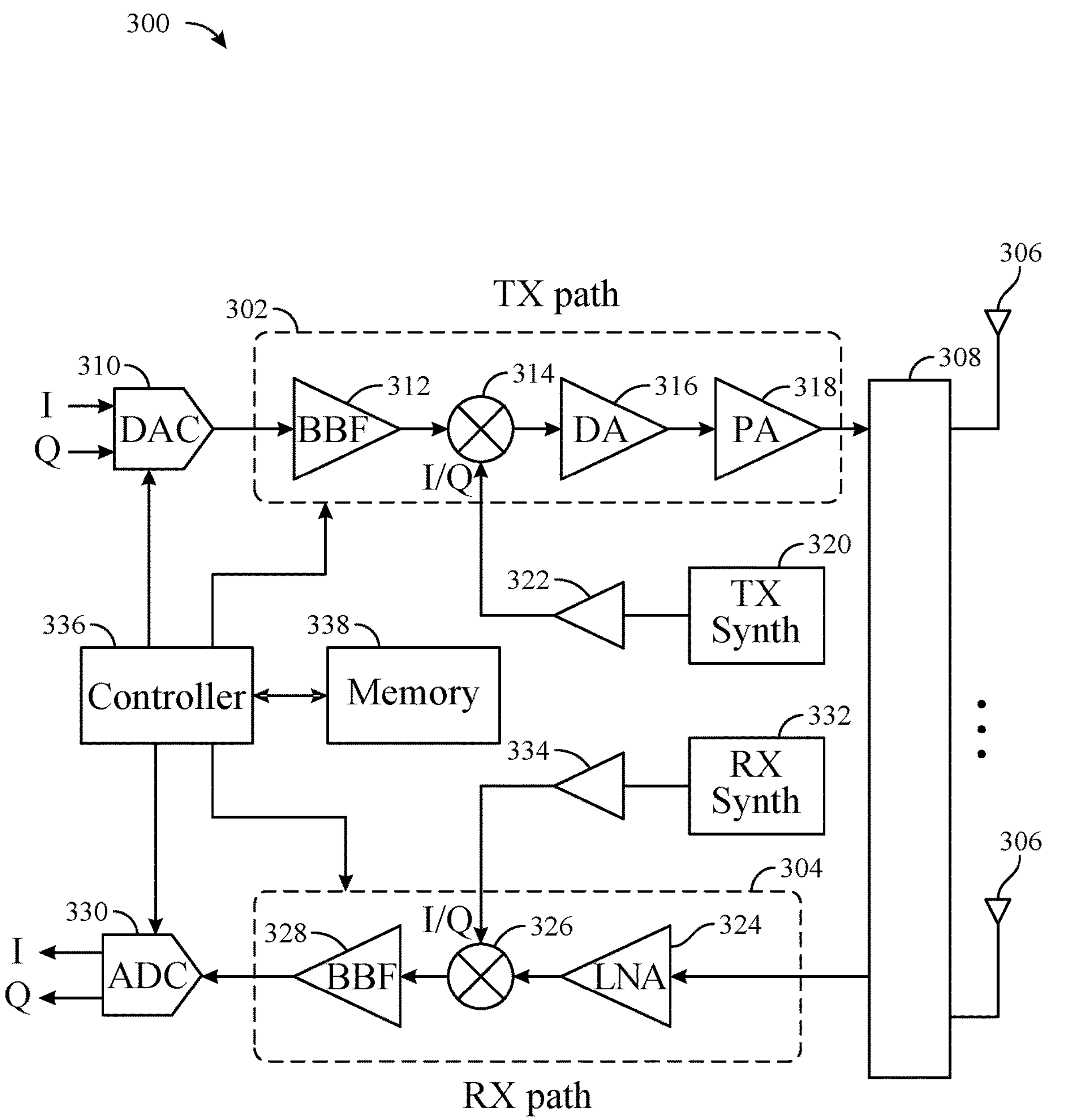
FIG. 3 is a block diagram of an example radio frequency (RF) transceiver, in which aspects of the present disclosure may be practiced.

FIG. 3 is a block diagram of an example radio frequency (RF) transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320, which may be buffered or amplified by amplifier 322 before being mixed with the baseband signals in the mixer 314. Similarly, the receive LO may be produced by an RX frequency synthesizer 332, which may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a multi-core VCO where one or more VCO cores of the multi-core VCO are turned off and tuned to reduce impact of the off VCO core on the phase noise of the on VCO core, as described in more detail herein.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used for any of various other suitable systems. For example, the techniques described herein to generate an oscillating signal may be applied to any suitable communication system such as a wired communication system.

Example VCO Circuits

Figure 4:
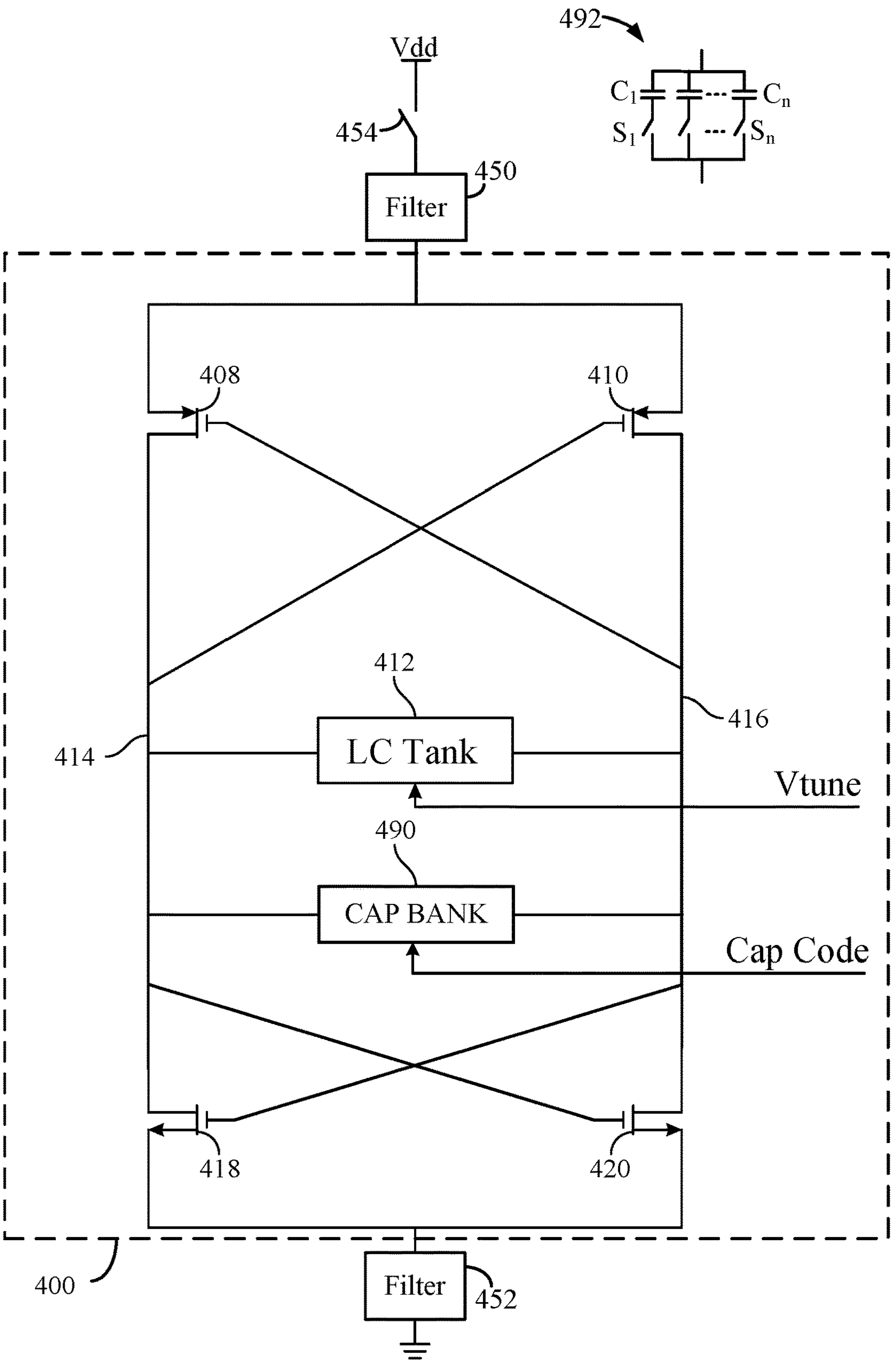
FIG. 4 illustrates an example voltage-controlled oscillator (VCO) core, in accordance with certain aspects of the present disclosure.

FIG. 4 illustrates an example VCO core 400, in accordance with certain aspects of the present disclosure. The VCO core 400 may be used to implement the synthesizer 320 or synthesizer 332 described with respect to FIG. 3. As shown, the VCO core 400 may include cross-coupled p-type metal-oxide-semiconductor (PMOS) transistors 408, 410 (e.g., transconductance (gm) transistors). Sources of transistors 408, 410 are coupled to a voltage rail (Vdd). In some cases, a filter 450 may be coupled between the sources of the transistors 408, 410 and Vdd for harmonic signal attenuation. For example, the filter 450 may be a notch filter configured to attenuate a frequency twice the oscillating frequency of the VCO core 400, reducing the second harmonic signal of the VCO core.

A gate of transistor 408 may be coupled to an output node 416 of the VCO core, and a gate of transistor 410 may be coupled to an output node 414, as shown. A tank circuit 412 (e.g., inductor-capacitor (LC) tank circuit) may be coupled between the output nodes 414, 416. A tuning voltage (Vtune) may be provided to the tank circuit 412 to adjust the oscillating frequency of the VCO core.

As shown, the VCO core 400 also includes cross-coupled n-type metal-oxide-semiconductor (NMOS) transistors 418, 420 (e.g., transconductance (gm) transistors). Sources of transistors 418, 420 are coupled to a reference potential node (e.g., electric ground). In some aspects, a filter 452 may be coupled between the sources of the transistors 418, 420 and the reference potential node for harmonic signal attenuation. For example, the filter 452 may be a notch filter configured to attenuate a frequency twice the oscillating frequency of the VCO core 400, reducing the second harmonic signal of the VCO core.

In some aspects, a capacitor bank 490 ("CAP BANK") may be coupled between the outputs 414, 416 and may be controlled using a capacitor code (e.g., a digital signal) to tune an oscillating frequency of the VCO core. For example, the capacitance of the capacitor bank 490 may be adjusted to tune the frequency of the VCO core. As shown in diagram 492, a capacitor bank may include capacitive elements $C_1$-$C_n$ (e.g., n being any positive integer) each selectively coupled between terminals of the capacitor bank (e.g., selectively coupled between outputs of the VCO core) via a respective switch $S_1$-$S_n$. The capacitor code may control the switches to set the number of capacitive elements coupled in parallel between the terminals of the capacitor bank, thereby setting the capacitance of the capacitor bank. In some implementations, the capacitor bank may be controlled to coarse-tune the frequency of the VCO core, and Vtune may be used to fine-tune the frequency of the VCO core.

Figure 5:
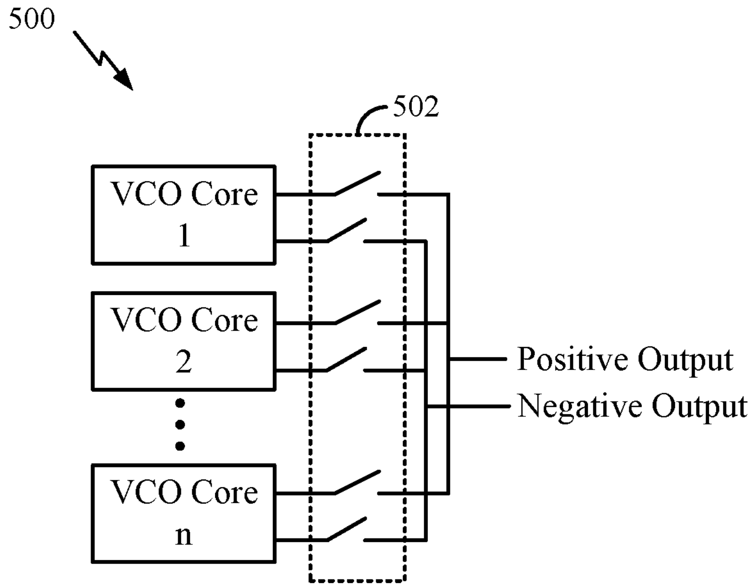
FIG. 5 is a block diagram illustrating an example multi-core VCO, in accordance with certain aspects of the present disclosure.

FIG. 5 is a block diagram illustrating an example multi-core VCO 500, in accordance with certain aspects of the present disclosure. For example, the multi-core VCO 500 may include multiple VCO cores 1-n, n being a positive integer. While more than two VCO cores are shown to facilitate understanding, the multi-core VCO may be implemented with at least two VCO cores. Each of the VCO cores may correspond to the VCO core 400 described with respect to FIG. 4. As shown, switches 502 may be used to selectively couple differential outputs (e.g., corresponding to outputs 414, 416 of FIG. 4) of each of the VCO cores to positive and negative outputs of the multi-core VCO (e.g., labeled "Positive Output" and "Negative Output"). In some aspects, one or more of the VCO cores may be turned on and one or more other VCO cores may be turned off. For example, two VCO cores may be turned on to generate an oscillating signal with a lower phase noise (e.g., as compared to using a single VCO core), albeit resulting in greater power consumption for the frequency synthesizer. A VCO core may be turned off by decoupling the output of the VCO core from the output of the multi-core VCO, and in some cases, opening the switch 454 to decouple the VCO core from Vdd. Thus, the off VCO core may be powered down and decoupled from the multi-core VCO output. Digital circuitry used to tune the VCO core may remain powered even when the VCO core is turned off in some aspects.

Example Techniques for Tuning a Multi-Core Voltage-Controlled Oscillator (VCO)

In reduced-core mode (e.g., a mode during which one or more of the VCO cores are turned off), the off VCO core(s) may load the on VCO core(s) and cause phase-noise degradation. For example, the inductive element for the inductor-capacitor (LC) tank of the on VCO core may have some magnetic coupling with the inductive element for the LC tank of the off VCO core. Therefore, due to the magnetic coupling, the off VCO core loads the on VCO core, degrading the phase noise of the on core VCO.

In some aspects of the present disclosure, to reduce the phase noise degradation of at least one on VCO core, at least one off VCO core may be set (e.g., by setting the capacitor code of the at least one off VCO core) to a frequency as far away from the oscillating frequency of the at least one on VCO core. For instance, when the on VCO core is operating at a low frequency (e.g., a frequency lower than a center frequency of the VCO core), the capacitor code of off VCO core may be set to a value corresponding to a maximum oscillating frequency. On the other hand, when the on core is operating at a high oscillating frequency (e.g., a frequency higher than the center frequency of the VCO core), the capacitor code for the off VCO core may be set to a value associated with a minimum oscillating frequency. In some aspects, the capacitor code for the off VCO core(s) may be set during a capacitor code search operation performed for the on VCO core(s), as described in more detail herein.

While some examples provided herein are described with respect to a single VCO core being on and a single VCO core being off to facilitate understanding, the aspects of the present disclosure may be applied to any number of on VCO cores and any number of off VCO cores. For example, if multiple VCO cores are on and operating at a high oscillating frequency, one or more other off VCO cores may be provided capacitor code values corresponding to a minimum oscillating frequency as described herein.

Figure 6:
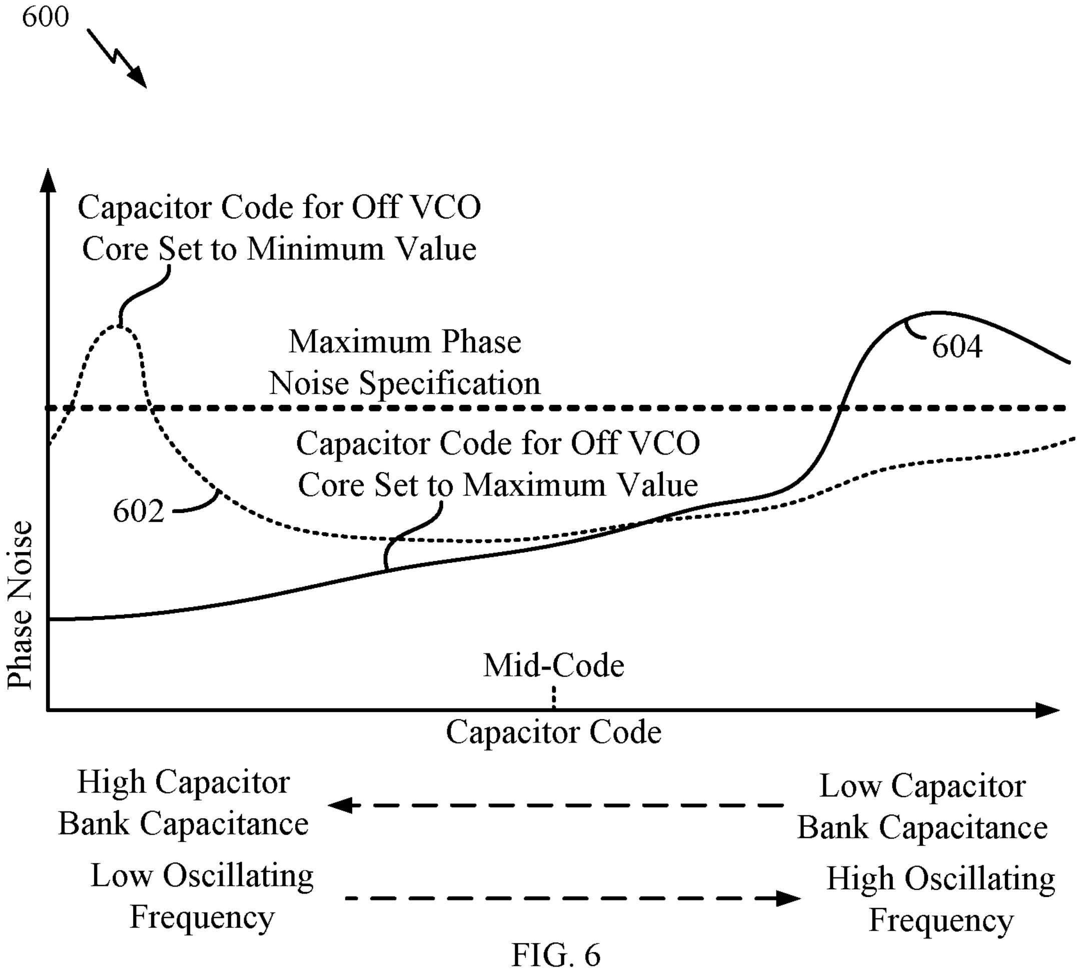
FIG. 6 is a graph illustrating a phase noise of an on VCO core when a capacitor code of an off VCO core is set to a maximum value and a minimum value.

FIG. 6 is a graph 600 illustrating a phase noise of an on VCO core when a capacitor code of an off VCO core is set to a maximum value and a minimum value. As the capacitor code increases, the total capacitance of the associated capacitor bank decreases (and vice versa). Moreover, as the capacitor code increases, the oscillating frequency of the VCO core increases (and vice versa). Curve 602 shows the phase noise of the on VCO core as a function of capacitor code when the capacitor code of the off VCO core is set a minimum value and curve 604 shows the phase noise of the on VCO core as a function of capacitor code when the capacitor code of the off VCO core is set a maximum value.

As shown, when the off VCO core capacitor code is set to the minimum value, the phase noise of the on VCO core within a lower range of the capacitor code (e.g., lower portion of the oscillating frequency range) may increase above a maximum phase noise specification. When the off VCO core capacitor code is set to the maximum value, the phase noise of the on VCO core within a higher range of the capacitor code (e.g., a higher portion of the oscillating frequency range) may increase above the maximum phase noise specification.

In some aspects of the present disclosure, when the on VCO core is operating with a capacitor code that is less than a mid-code (e.g., a code that is in the middle of capacitor code range), then the capacitor code for the off VCO core may be set to a maximum capacitor code. Alternatively, when the on VCO core is operating with a capacitor code greater than the mid-code, the capacitor code for the off VCO core may be set to a minimum capacitor code. In this manner, the increases in the phase noise of the on VCO core described with respect to FIG. 6 may be avoided (or at least reduced), providing a more flat phase noise response as compared to conventional implementations.

Figure 7:
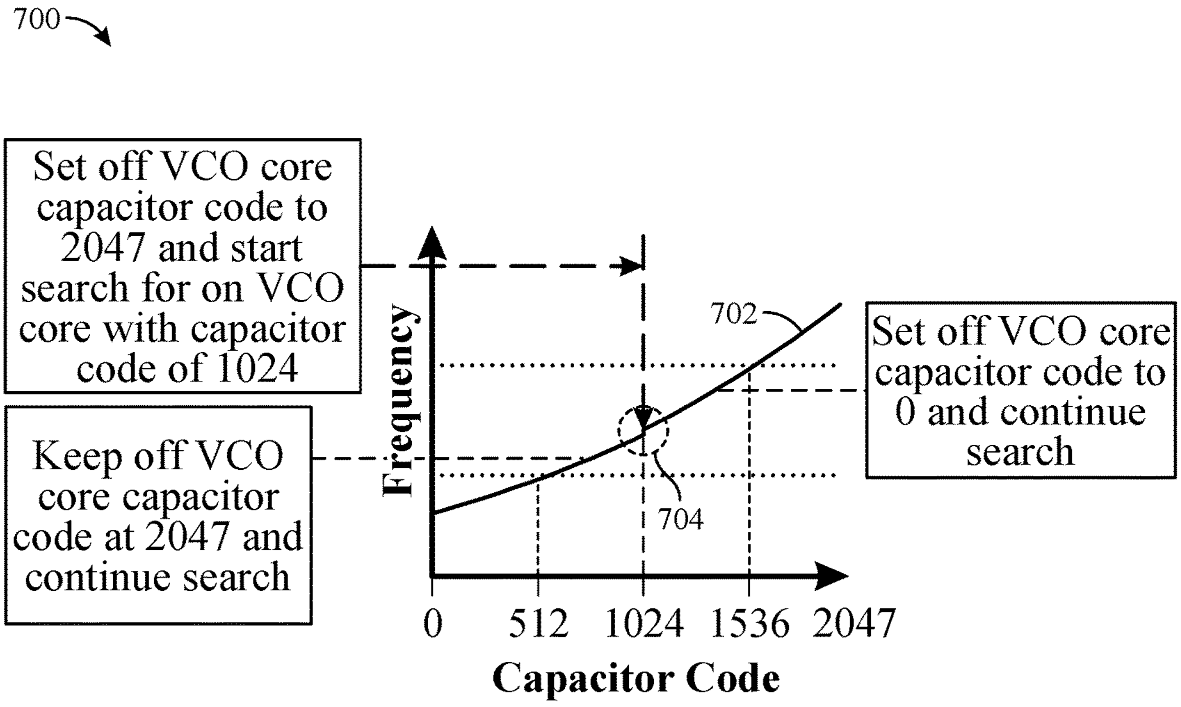
FIG. 7 illustrates example techniques for setting a capacitor code of an off VCO core during a frequency search of an on VCO core, in accordance with certain aspects of the present disclosure.

FIG. 7 illustrates example techniques for setting a capacitor code of an off VCO core during a capacitor code search of the on VCO core, in accordance with certain aspects of the present disclosure. The capacitor code search (also referred to herein as "a frequency search operation," which may occur during a frequency search phase) may involve adjusting the capacitor code for the on VCO core until a specific oscillating frequency (or frequency range) is reached. The curve 702 shows the frequency of the on VCO core in response to adjustments of the capacitor code.

In some aspects, the off VCO core capacitor code may be changed after one or two most significant bit (MSB) searches of the on VCO core capacitor code, and the search for the on VCO core may continue. For example, to begin the search, the capacitor code for the off VCO core may be set to a maximum value (e.g., 2047), and the capacitor code for the on VCO core may be set to the mid-code (e.g., 1024). If the oscillating frequency of the VCO core is less than a target oscillating frequency, the capacitor code may be increased and vice versa. For instance, if the oscillating frequency of the VCO core is more than a target oscillating frequency, the MSB of the capacitor code may be changed from logic high to logic low. In some aspects, if the capacitor code increases (e.g., is greater than the mid-code), the capacitor code for the off VCO core may be set to a minimum capacitor code value (e.g., 0), and the search for the on VCO core may continue. Similarly, if the capacitor code decreases (e.g., is less than the mid-code), the capacitor code for the off VCO core may be set to a maximum capacitor code value (e.g., 2047), and the search for the on VCO core may continue.

While in the example provided the off VCO core capacitor code is adjusted based on whether the on VCO core capacitor code is less than or greater than (or equal to) the mid-code, the off VCO core capacitor code may be adjusted at any capacitor code threshold or thresholds. For example, the off VCO core capacitor code may be set to the minimum capacitor code value if the on VCO core capacitor code increases above a first threshold value (e.g., 1536), and the off VCO core capacitor code may be set to the maximum capacitor code value if the on VCO core capacitor code decreases below a second threshold value (e.g., 512) less than the first threshold value.

Adjusting the capacitor code of the off VCO core may impact the frequency of the on VCO core. For example, as shown in region 704 of graph 700, when the capacitor code for the off VCO core is adjusted from a maximum capacitor code value to a minimum capacitor code value, the frequency of the on VCO core increases. When the capacitor code for the off VCO core is adjusted from a minimum capacitor code value to a maximum capacitor code value, the frequency of the on VCO core decreases. Therefore, in some aspects, the capacitor code for the off VCO core may be allowed to change (e.g., from the minimum to the maximum capacitor code or vice versa) only once during a search operation of the on VCO core to avoid the on VCO core capacitor code transitioning back and forth (e.g., causing a ping-pong effect) during the search operation. For example, if the on VCO core capacitor code to meet a target frequency is around the mid-code, the capacitor code may increase above the mid-code during the search, causing the capacitor code for the off VCO core to transition from a maximum capacitor code to a minimum capacitor code, which in turn causes an increase in the frequency of the on VCO core above the target frequency. To compensate, at least adjust, for this increase in frequency during the search, the on VCO core capacitor code may be decreased below the mid-code, which then causes the off VCO core capacitor code to transition from the minimum capacitor code to the maximum capacitor code, which in turn causes a decrease in the frequency of the on VCO core below the target value. Again to compensate, or at least adjust, the capacitor code of the on VCO core may be increased. This process may continue, causing a ping-pong effect. To avoid this effect, the capacitor code for the off VCO core may be allowed to changed (e.g., from minimum to maximum capacitor code or vice versa) only once during the search operation of the on VCO core, as described.

Figure 8:
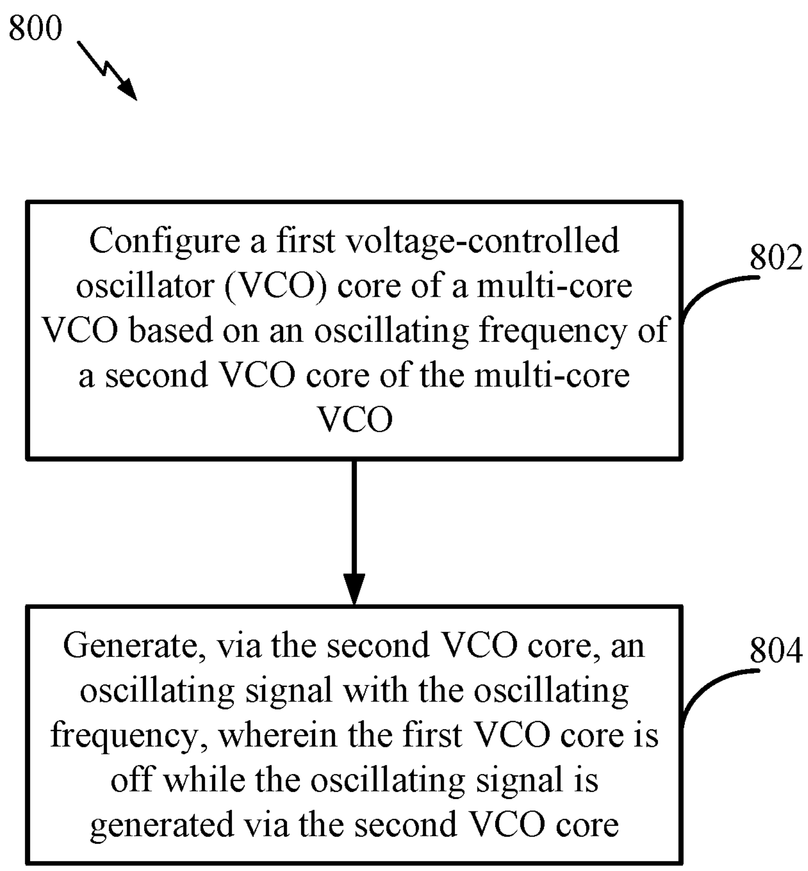
FIG. 8 is a flow diagram illustrating example operations for oscillating signal generation, in accordance with certain aspects of the present disclosure.

FIG. 8 is a flow diagram illustrating example operations 800 for oscillating signal generation, in accordance with certain aspects of the present disclosure. The operations 800 may be performed, for example, by an oscillating circuit such as the multi-core VCO 500 of FIG. 5.

At block 802, the oscillating circuit configures a first VCO core (e.g., VCO core 1 of FIG. 5) of the multi-core VCO based on an oscillating frequency of a second VCO core (e.g., VCO core 2 of FIG. 5) of the multi-core VCO. At block 804, the oscillating circuit generates, via the second VCO core, an oscillating signal with the oscillating frequency. In some aspects, the first VCO core is off while the oscillating signal is generated via the second VCO core. For example, the oscillating circuit may decouple (e.g., via one or more switches 502 of FIG. 5) the first VCO core from one or more outputs (e.g., positive output and negative output shown in FIG. 5) of the multi-core VCO to turn off the first VCO core prior to generating the oscillating signal via the second VCO core.

In some aspects, configuring the first VCO core may include configuring a capacitor bank (e.g., corresponding to the capacitor bank 490 of FIG. 4) of the first VCO core coupled between a first output (e.g., corresponding to output 414 of FIG. 4) and a second output of the first VCO core (e.g., corresponding to output 416 of FIG. 4). Configuring the first VCO core may include configuring the capacitor bank with a first capacitance based on the oscillating frequency of the second VCO core being less than a first threshold or configuring the capacitor bank with a second capacitance greater than the first capacitance based on the oscillating frequency of the second VCO core being greater than a second threshold. The first threshold may be equal to or less than the second threshold. For example, the first threshold and the second threshold may be the same and correspond to a mid-code associated with a capacitor code used to configure the capacitor bank. In some aspects, the first capacitance may be a minimum capacitance of the capacitor bank, and the second capacitance may be a maximum capacitance of the capacitor bank. Configuring the capacitor bank may include selectively coupling, via a respective switch (e.g., corresponding to switches $S_1$-$S_n$ shown in diagram 492 of FIG. 4), each of a plurality of capacitive elements (e.g., corresponding to switches $C_1$-$C_n$ shown in diagram 492 of FIG. 4) of the capacitor bank between outputs of the first VCO core.

In some aspects, the oscillating circuit may perform a frequency search operation to configure the second VCO core with the oscillating frequency. The capacitor bank of the first VCO core may be configured during the frequency search operation. Configuring the capacitor bank may include configuring a capacitance of the capacitor bank after a first frequency adjustment is performed for the second VCO core during the frequency search operation. The search frequency operation further continues with one or more second frequency adjustments after the capacitance of the capacitor bank is configured. Configuring the capacitor bank may include configuring a capacitance of the capacitor bank, and the capacitance of the capacitor bank may be adjusted only once during the frequency search operation.

EXAMPLE ASPECTS

In addition to the various aspects described above, specific combinations of aspects are within the scope of the present disclosure, some of which are detailed below:

Aspect 1: A method for oscillating signal generation, comprising: configuring a first voltage-controlled oscillator (VCO) core of a multi-core VCO based on an oscillating frequency of a second VCO core of the multi-core VCO; and generating, via the second VCO core, an oscillating signal with the oscillating frequency, wherein the first VCO core is off while the oscillating signal is generated via the second VCO core.

Aspect 2: The method of Aspect 1, wherein configuring the first VCO core comprises configuring a capacitor bank of the first VCO core coupled between a first output and a second output of the first VCO core.

Aspect 3: The method of Aspect 2, wherein configuring the first VCO core comprises: configuring the capacitor bank with a first capacitance based on the oscillating frequency of the second VCO core being less than a first threshold; or configuring the capacitor bank with a second capacitance greater than the first capacitance based on the oscillating frequency of the second VCO core being greater than a second threshold, the first threshold being equal to or less than the second threshold.

Aspect 4: The method of Aspect 3, wherein the first capacitance comprises a minimum capacitance of the capacitor bank, and wherein the second capacitance comprises a maximum capacitance of the capacitor bank.

Aspect 5: The method of Aspect 3 or 4, wherein the first threshold and the second threshold are the same and correspond to a middle capacitor code used to configure the capacitor bank.

Aspect 6: The method according to any of Aspects 2-5, wherein configuring the capacitor bank comprises selectively coupling, via a respective switch, each of a plurality of capacitive elements of the capacitor bank between outputs of the first VCO core.

Aspect 7: The method according to any of Aspects 2-6, further comprising performing a frequency search operation to configure the second VCO core with the oscillating frequency, wherein the capacitor bank of the first VCO core is configured during the frequency search operation.

Aspect 8: The method of Aspect 7, wherein configuring the capacitor bank comprises configuring a capacitance of the capacitor bank after a first frequency adjustment is performed for the second VCO core during the frequency search operation, and wherein the search frequency operation further continues with one or more second frequency adjustments after the capacitance of the capacitor bank is configured.

Aspect 9: The method of Aspect 7 or 8, wherein configuring the capacitor bank comprises configuring a capacitance of the capacitor bank, and wherein the capacitance of the capacitor bank is adjusted only once during the frequency search operation.

Aspect 10: The method according to any of Aspects 1-9, further comprising decoupling the first VCO core from one or more outputs of the multi-core VCO to turn off the first VCO core prior to generating the oscillating signal via the second VCO core.

Aspect 11: A multi-core voltage-controlled oscillator (VCO) comprising: a first VCO core selectively coupled to one or more outputs of the multi-core VCO; and a second VCO core selectively coupled to the one or more outputs of the multi-core VCO, the first VCO core being capable of being configured based on an oscillating frequency of the second VCO core, wherein the second VCO core is configured to generate an oscillating signal with the oscillating frequency, and wherein the first VCO core is configured to be off while the oscillating signal is generated via the second VCO core.

Aspect 12: The multi-core VCO of Aspect 11, wherein: the first VCO core comprises a capacitor bank coupled between a first output and a second output of the first VCO core; and the first VCO core being capable of being configured based on the oscillating frequency comprises the capacitor bank being capable of being configured based on the oscillating frequency.

Aspect 13: The multi-core VCO of Aspect 12, wherein the first VCO core being capable of being configured comprises: the capacitor bank being capable of being configured with a first capacitance based on the oscillating frequency of the second VCO core being less than a first threshold; or the capacitor bank being capable of being configured with a second capacitance greater than the first capacitance based on the oscillating frequency of the second VCO core being greater than a second threshold, the first threshold being equal to or less than the second threshold.

Aspect 14: The multi-core VCO of Aspect 13, wherein the first capacitance comprises a minimum capacitance of the capacitor bank, and wherein the second capacitance comprises a maximum capacitance of the capacitor bank.

Aspect 15: The multi-core VCO of Aspect 13 or 14, wherein the first threshold and the second threshold are the same and correspond to a middle capacitor code used to configure the capacitor bank.

Aspect 16: The multi-core VCO according to any of Aspects 12-15, wherein: the capacitor bank comprises a plurality of capacitive elements, each of the plurality of capacitive elements being selectively coupled between outputs of the first VCO core via a respective one of a plurality of switches; and the capacitor bank is configured using the plurality of switches.

Aspect 17: The multi-core VCO according to any of Aspects 12-16, wherein: the second VCO core is capable of being configured with the oscillating frequency during a frequency search phase; and the capacitor bank of the first VCO core is capable of being configured during the frequency search phase.

Aspect 18: The multi-core VCO of Aspect 17, wherein: the capacitor bank being capable of being configured comprises a capacitance of the capacitor bank being capable of being configured after a first frequency adjustment is performed for the second VCO core during the frequency search phase; and the frequency search phase continues with one or more second frequency adjustments after the capacitance of the capacitor bank is configured.

Aspect 19: The multi-core VCO of Aspect 17 or 18, wherein: the capacitor bank being capable of being configured comprises a capacitance of the capacitor bank being capable of being configured; and the capacitance of the capacitor bank is configured to be adjusted only once during the frequency search phase.

Aspect 20: A wireless device comprising: one or more antennas; and a transmitter or a receiver coupled to the one or more antennas and including a frequency synthesizer, wherein the frequency synthesizer includes a multi-core voltage-controlled oscillator (VCO) comprising: a first VCO core selectively coupled to one or more outputs of the multi-core VCO; and a second VCO core selectively coupled to the one or more outputs of the multi-core VCO, the first VCO core being capable of being configured based on an oscillating frequency of the second VCO core, wherein the second VCO core is configured to generate an oscillating signal with the oscillating frequency, and wherein the first VCO core is configured to be off while the oscillating signal is generated via the second VCO core.

The above description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A method for oscillating signal generation, comprising:
configuring a first voltage-controlled oscillator (VCO) core of a multi-core VCO based on an oscillating frequency of a second VCO core of the multi-core VCO, wherein the first VCO core is separate from the second VCO core, wherein configuring the first VCO core comprises configuring a capacitor bank of the first VCO core coupled between a first output and a second output of the first VCO core; and
generating, via the second VCO core, an oscillating signal with the oscillating frequency, wherein the first VCO core is off while the oscillating signal is generated via the second VCO core.

2. The method of claim 1, further comprising decoupling the first VCO core from one or more outputs of the multi-core VCO to turn off the first VCO core prior to generating the oscillating signal via the second VCO core.

3. The method of claim 1, wherein configuring the first VCO core comprises:
configuring the capacitor bank with a first capacitance based on the oscillating frequency of the second VCO core being less than a first threshold; or
configuring the capacitor bank with a second capacitance greater than the first capacitance based on the oscillating frequency of the second VCO core being greater than a second threshold, the first threshold being equal to or less than the second threshold.

4. The method of claim 3, wherein the first capacitance comprises a minimum capacitance of the capacitor bank, and wherein the second capacitance comprises a maximum capacitance of the capacitor bank.

5. The method of claim 3, wherein the first threshold and the second threshold are the same and correspond to a middle capacitor code used to configure the capacitor bank.

6. The method of claim 1, wherein configuring the capacitor bank comprises selectively coupling, via a respective switch, each of a plurality of capacitive elements of the capacitor bank between outputs of the first VCO core.

7. The method of claim 1, further comprising performing a frequency search operation to configure the second VCO core with the oscillating frequency, wherein the capacitor bank of the first VCO core is configured during the frequency search operation.

8. The method of claim 7, wherein configuring the capacitor bank further comprises configuring a capacitance of the capacitor bank after a first frequency adjustment is performed for the second VCO core during the frequency search operation, and wherein the search frequency operation further continues with one or more second frequency adjustments after the capacitance of the capacitor bank is configured.

9. The method of claim 7, wherein configuring the capacitor bank comprises configuring a capacitance of the capacitor bank, and wherein the capacitance of the capacitor bank is adjusted only once during the frequency search operation.

10. A multi-core voltage-controlled oscillator (VCO) comprising:
a first VCO core selectively coupled to one or more outputs of the multi-core VCO, the first VCO core comprising a capacitor bank coupled between a first output and a second output of the first VCO core; and
a second VCO core selectively coupled to the one or more outputs of the multi-core VCO, wherein the first VCO core is separate from the second VCO core, the capacitor bank being capable of being configured based on an oscillating frequency of the second VCO core, wherein the second VCO core is configured to generate an oscillating signal with the oscillating frequency, and wherein the first VCO core is configured to be off while the oscillating signal is generated via the second VCO core.

11. The multi-core VCO of claim 10, wherein the first VCO core being capable of being configured comprises:

the capacitor bank being capable of being configured with a first capacitance based on the oscillating frequency of the second VCO core being less than a first threshold; or the capacitor bank being capable of being configured with a second capacitance greater than the first capacitance based on the oscillating frequency of the second VCO core being greater than a second threshold, the first threshold being equal to or less than the second threshold.

12. The multi-core VCO of claim 11, wherein the first capacitance comprises a minimum capacitance of the capacitor bank, and wherein the second capacitance comprises a maximum capacitance of the capacitor bank.

13. The multi-core VCO of claim 11, wherein the first threshold and the second threshold are the same and correspond to a middle capacitor code used to configure the capacitor bank.

14. The multi-core VCO of claim 10, wherein:

the capacitor bank comprises a plurality of capacitive elements, each of the plurality of capacitive elements being selectively coupled between outputs of the first VCO core via a respective one of a plurality of switches; and the capacitor bank is configured using the plurality of switches.

15. The multi-core VCO of claim 10, wherein:

the second VCO core is capable of being configured with the oscillating frequency during a frequency search phase; and the capacitor bank of the first VCO core is capable of being configured during the frequency search phase.

16. The multi-core VCO of claim 15, wherein:

the capacitor bank being capable of being configured comprises a capacitance of the capacitor bank being capable of being configured after a first frequency adjustment is performed for the second VCO core during the frequency search phase; and the frequency search phase continues with one or more second frequency adjustments after the capacitance of the capacitor bank is configured.

17. The multi-core VCO of claim 15, wherein:

the capacitor bank being capable of being configured comprises a capacitance of the capacitor bank being capable of being configured; and the capacitance of the capacitor bank is configured to be adjusted only once during the frequency search phase.

18. A wireless device comprising:

one or more antennas; and a transmitter or a receiver coupled to the one or more antennas and including a frequency synthesizer, wherein the frequency synthesizer includes a multi-core voltage-controlled oscillator (VCO) comprising:

a first VCO core selectively coupled to one or more outputs of the multi-core VCO, the first VCO core comprising a capacitor bank coupled between a first output and a second output of the first VCO core; and a second VCO core selectively coupled to the one or more outputs of the multi-core VCO, wherein the first VCO core is separate from the second VCO core, the capacitor bank being capable of being configured based on an oscillating frequency of the second VCO core, wherein the second VCO core is configured to generate an oscillating signal with the oscillating frequency, and wherein the first VCO core is configured to be off while the oscillating signal is generated via the second VCO core.

* * * * *